United States Patent
Bertin et al.

(10) Patent No.: US 6,195,027 B1
(45) Date of Patent: Feb. 27, 2001

(54) CAPACITIVE PRECHARGING AND DISCHARGING NETWORK FOR CONVERTING N BIT INPUT INTO M BIT OUTPUT

(75) Inventors: Claude L. Bertin, South Burlington; John A. Fifield, Underhill; Russell J. Houghton, Essex Junction; Christopher P. Miller, Underhill; Steven W. Tomashot, Williston; William R. Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,744

(22) Filed: Apr. 30, 1999

(51) Int. Cl.[7] .............................. H03M 7/20; G11C 8/00; H03K 19/84
(52) U.S. Cl. ............................ 341/102; 326/108
(58) Field of Search ............................ 341/102; 326/105, 326/106, 108, 112, 115, 119, 121

(56) References Cited

U.S. PATENT DOCUMENTS

| | | | |
|---|---|---|---|
| 3,631,465 | * 12/1971 | Heeren | 341/102 X |
| 4,010,453 | 3/1977 | Lewis . | |
| 4,112,512 | 9/1978 | Arzubi et al. . | |
| 4,305,139 | 12/1981 | Zbrozek . | |
| 5,477,186 | 12/1995 | Kobatake . | |
| 5,485,110 | 1/1996 | Jones et al. . | |
| 5,633,600 | 5/1997 | Ohnishi . | |
| 5,815,005 | * 9/1998 | Bosshart | 326/95 |

OTHER PUBLICATIONS

"Sub–1–V Swing Internal Bus Architecture for Future Low–Power ULSI's", by Y. Nakagome, IEEE Journal of Solid State Circuits, vol. 28, No. 4 (Apr., 1993).

* cited by examiner

Primary Examiner—Patrick Wamsley
(74) Attorney, Agent, or Firm—William N. Hogg

(57) ABSTRACT

A method and structure for decoding n input signals and their complements to one of m output signals is provided. A capacitive network is provided having m output nodes. The output nodes are precharged to a given voltage value. N input signals and their complements are provided each having either a high value or a low value. At least one but less than all of the output nodes are discharged to a value less than the given voltage but greater than ground in output patterns responsive to given input patterns of the true and complement values of the input signals. The output patterns of the discharged nodes is such as to provide one and only one discharged or one and only one undischarged node for any given pattern of input signals. Preferably the capacitive network includes NMOS inversion capacitors.

39 Claims, 6 Drawing Sheets

CAPACITIVE PRECHARGING AND DISCHARGING NETWORK FOR CONVERTING N BIT INPUT INTO M BIT OUTPUT

BACKGROUND OF THE INVENTION

1. Field of the Invention

This invention relates generally to signal decode circuitry and a method of decoding input signals, and more particularly to circuitry and method for decoding input signals. In even more particular aspects the present invention relates to a signal decode technique in which capacitive charge is used to produce a reduced signal swing decode.

2. Background Information

Conventional prior art techniques for signal decoding have used bipolar DC bias current in a resistor network to provide cascode decoding. While this does provide a reduced voltage swing for decoding, this bipolar technique results in high power consumption. Thus it is desirable to provide a low or limited swing signal decoding that reduces power consumption.

SUMMARY OF THE INVENTION

According to the present invention, a method and structure for decoding n input signals and their complements to one of m output signals are provided. A capacitive network is provided having m output nodes. The output nodes are precharged to a given voltage value. N input signals and their complements are provided each having either a high value or a low value. At least one but less than all of the output nodes are discharged to a value less than the given voltage but greater than ground in output patterns responsive to given input patterns of the true and complement values of the input signals. The output patterns of the discharged nodes is such as to provide one and only one discharged or one and only one undischarged node for any given pattern of input signals. Preferably the capacitive network includes NMOS inversion capacitors.

DESCRIPTION OF THE PREFERRED EMBODIMENTS

Figure 1:
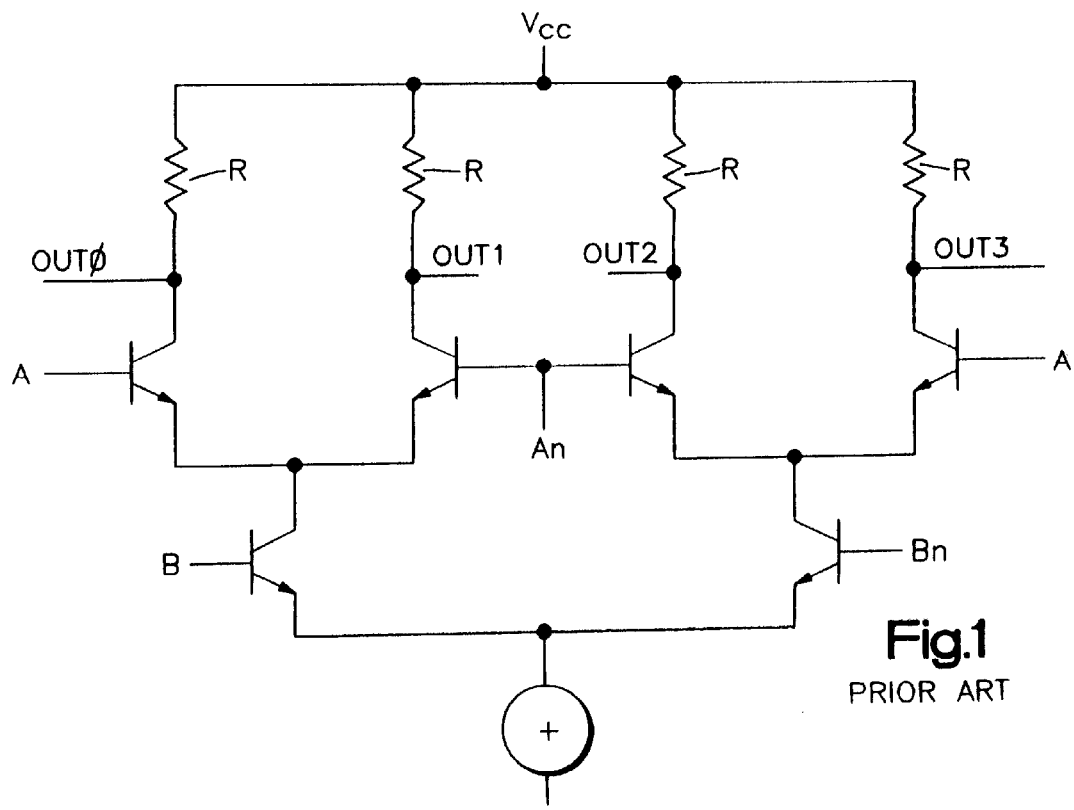
FIG. 1 is a circuit diagram of one embodiment of a prior art negative select cascode decoder.
Figure 2:
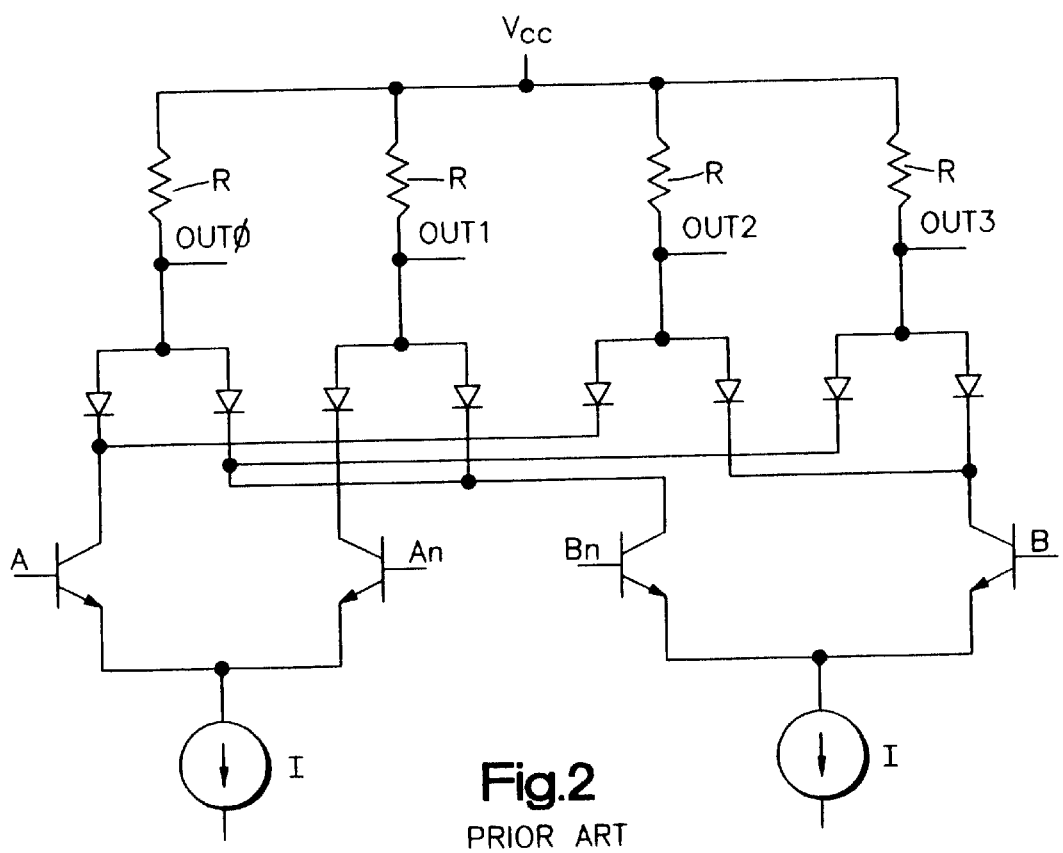
FIG. 2 is a circuit diagram of one embodiment of a prior art positive select cascode decoder.

Referring to the drawings, and for the present to FIGS. 1 and 2 circuit diagrams of prior art negative select and positive select cascode decoders respectively. (A negative select decode circuit is one wherein one value goes lower than the others and the signal that goes lower or low is the active signal. Conversely in a positive select decode circuit all of the non-selected signals go low or lower except the signal that is active which stays high.) These are bipolar implementations of limited signal swing decoders. In these implementations, since static operating current is being used to drive the decoder, there is quite high power consumption. Thus while this does accomplish the objective of limiting the signal swing at the output of the decoder, it does not reduce the power consumption required.

Figure 3:
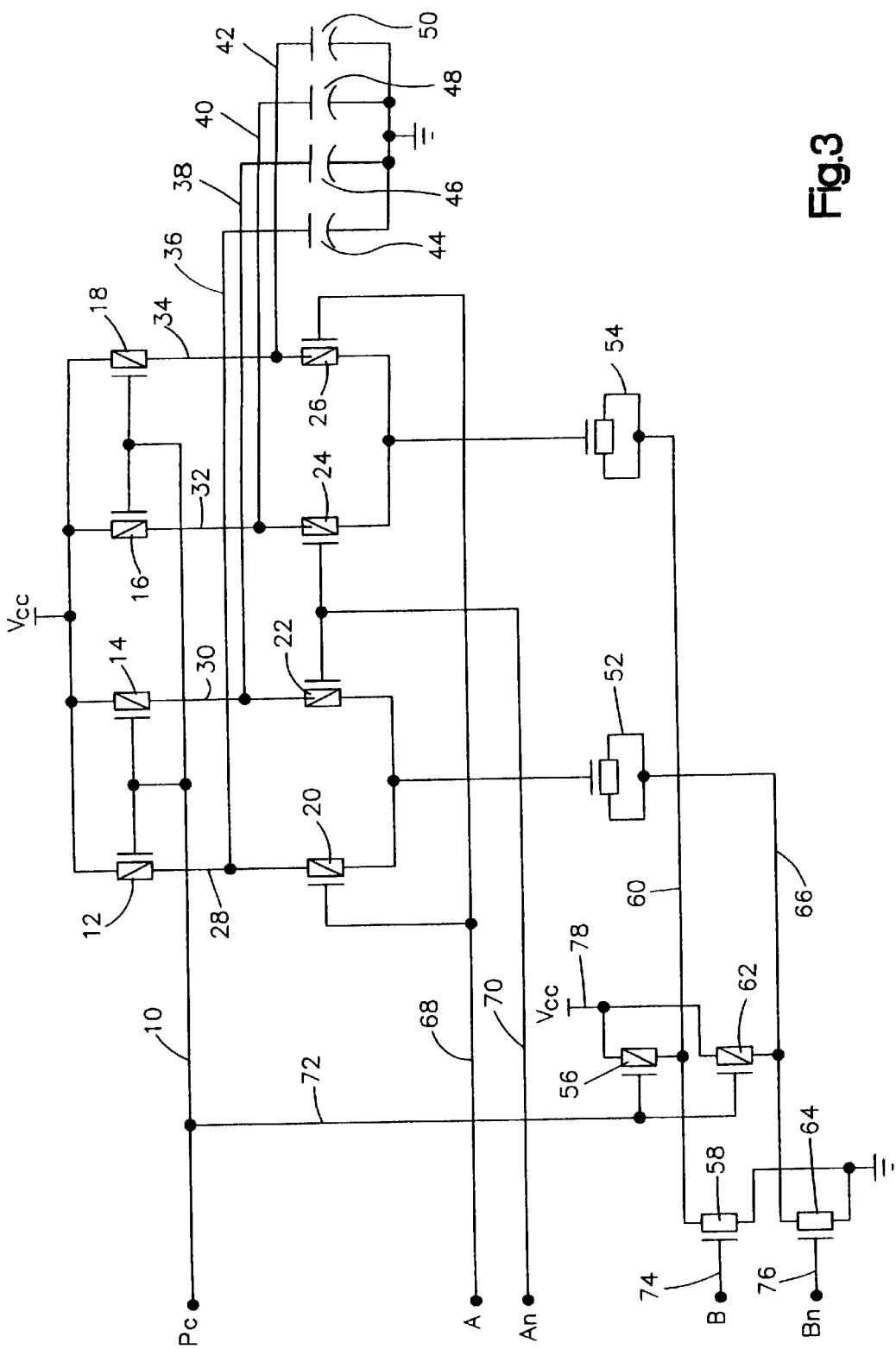
FIG. 3 is a circuit diagram of a limited swing negative select charge driven decoder according to this invention.

Referring now to FIG. 3 a limited swing negative select charge driven decoder embodiment of the present invention is shown. In this embodiment the decoder is charge driven, rather than current driven as in FIG. 1 and a capacitive network is used to limit the signal swing. The circuit has a precharge control line 10 connected to the gates of each of four PFET transistors 12, 14, 16, and 18. The source of each of the PFETs 12, 14, 16, and 18 is connected to the operating voltage Vcc which typically may be 3.3 volts in certain conventional computers. The drains of each of the PFETs 12, 14, 16 and 18 are connected respectively to the sources of PFET transistors 20, 22, 24 and 26 through circuit traces 28. 30, 32 and 34 respectively. The traces 28. 30, 32 and 34 are connected to output nodes 36, 38, 40 and 42 respectively, which output nodes are connected to output load capacitors 44, 46, 48 and 50 respectively. The sources of the PFETs 20 and 22 are tied together and connected to the gate of NFET transistor 52 and the sources of the PFETs 24and 26 are tied together and connected to the gate of NFET transistor 54. The NFETs 52 and 54 are connected as NMOS inversion transistors which causes them to act as non-linear capacitive elements having a relatively higher capacitance above a given threshold voltage, and a relatively lower capacitance below the given threshold voltage in a well-known manner. (It is to be understood that the circuit could also be implemented using PMOS inversion transistors in a manner that will be apparent to one skilled in the art.) The source/drain of NFET 54 is connected to the drain of PFET transistor 56 and to the drain of NFET transistor 58 through circuit trace 60, and the source/drain of NFET 52 is connected to the drain of PFET transistor 62 and to drain of NFET transistor 64 through circuit trace 66. Circuit trace 68 connects the gate electrodes of PFETs 20 and 26 to a first signal input designated as A sometimes referred to as the "true value", and circuit trace 70 connects the gate electrodes of PFETs 22 and 24 to the "complement" of signal A designated as An. (The complement of a signal is the opposite value of the true value of the signal; e.g. if the signal is high the complement is low, and if the value of the signal is low the complement is high.) The signal and its complement always have to be opposites as is well known in the art. Circuit trace 74 connects the gate of NFET 58 to a second signal input designated as B, and circuit trace 76 connects the gate of NFET 64 to the complement of B signal designated as Bn. The sources of PFETs 56 and 62 are connected to Vcc through circuit trace 78.

To have the signal swing reduced it is necessary to balance the capacitive value of each of the NFETs 52 and 54 with the capacitive values of the load capacitors 44, 46, 48, and 50. For example to reduce the voltage swing from 3.3. volts to about 0.3 volts the capacitance of each of the NFETs 54 and 56 should be about one-tenth of the capacitance of each of the capacitors 44, 46, 48, and 50 i.e. a ratio f about 1:10. As will be described presently, depending upon the permitted values of the signals A, An, B, and Bn, one of the nodes 36, 38, 40, 42, will go lower, sometimes referred to as low, and the rest will remain at Vcc voltage. With this ratio of capacitances the selected node will go to about 3.0 volts and the others remain at 3.3 volts (assuming that Vcc is 3.3 volts). Also, the decoding is charge driven based on the capacitances of the load capacitors and the NMOS inversion capacitors and not by current, thus reducing the power requirements.

Figure 3A:
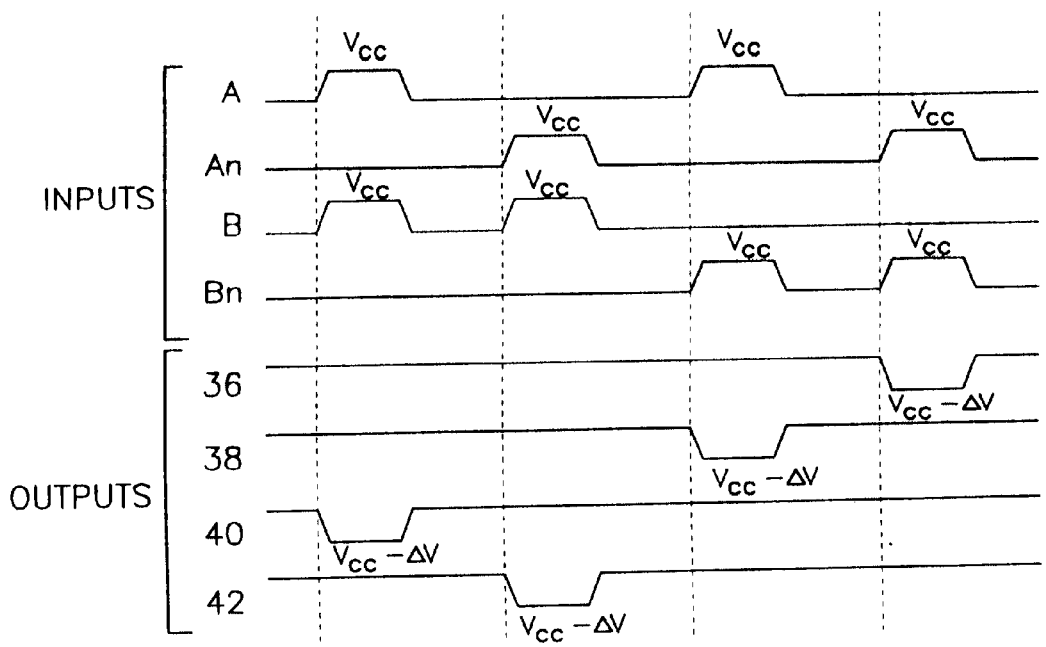
FIG. 3a is a signal diagram of the operation of the decoder of FIG. 3.

The operation of the circuit of FIG. 3 is as follows with the wave forms of the operating signals being shown in FIG. 3a. First, it should be remembered that PFETs are turned on when the signal is low and turned off when the signal is high, and the opposite is true of NFETs. First, when the signal on the precharge line is low, PFETs 12,14,16, and 18 are "on" and Vcc precharges all of the nodes 36,38, 40 and 42 to the Vcc voltage, e.g. 3.3 volts and the PFETs 56 and 62 are on pre-charging the other sides of the inversion capacitor NFETs 52 and 54 also to the Vcc voltage, e.g. 3.3 Volts. Thus, both sides of the inversion NFETs 52 and 54 are at the same voltage level. When two of the input signals A, An, B, or Bn become active high the signal on the precharge line 10 also goes high, turning "off" the PFETs 12, 14, 16, and 18, and PFETs 56 and 62 thus isolating the precharge of e.g. 3.3 volts on the output nodes 36, 38, 40, and 42. Truth Table 1 below shows the outputs on the nodes 36, 38, 40, and 42 with different combinations of high/low input signals.

TABLE I

| INPUT | | | | OUTPUT | | | |
|---|---|---|---|---|---|---|---|
| A | An | B | Bn | 36 | 38 | 40 | 42 |
| VCC | 0 | VCC | 0 | VCC | VCC | VCC-?V | VCC |
| 0 | VCC | VCC | 0 | VCC | VCC | VCC | VCC-?V |
| VCC | 0 | 0 | VCC | VCC | VCC-?V | VCC | VCC |
| 0 | VCC | 0 | VCC | VCC-?V | VCC | VCC | VCC |

OUTPUT Voltages:
Selected OUTPUT = VCC-?V
Unselected OUTPUT = VCC

Assuming that input signals A and B go active high, then An and Bn will remain low. In such a case the signal on trace 68 goes high turning "off" PFETs 20 and 26, and the An signal on trace 70 remains low turning on PFETS 22 and 24. The Bn signal is also low turning off NFET 64. Thus nodes 36, 38 and 42 are isolated from ground and from Vcc and will maintain their precharge voltage, e.g. 3.3 volts. However, the signal B is high on trace 74 thus turning on NFET 58 thus connecting NMOS inversion capacitor 54 to ground and hence establishing a path to ground from node 40, through PFET 24, NMOS inversion capacitor 54, and NFET 58. As indicated earlier this will cause the node 40 to drop or fall in value depending on the ratio of the capacitance of NMOS inversion capacitor 54 and the capacitance of the capacitor 48. As indicated above if this ratio is about 1:10 then the drop in voltage ΔV on node 40 will be about 1/10 the value of Vcc, which when Vcc is 3.3 the ΔV value will be about 0.3V and the voltage on node 40 will be about 3.0 volts. Thus it will be noted that the reduced signal swing has been achieved using charge driven nodes and not current driven, thus reducing the power requirements. As can be seen from Table 1 and FIG. 3a, when inputs An and B are both high and A and Bn are both low nodes, 36, 38, and 40 are high and node 42 is low; when inputs A and Bn are both high and inputs An and B are both low, nodes 36, 40, and 42 are high, and node 38 is low; and, when inputs An and Bn are both high and A and B are both low, then nodes 38, 40 and 42 are high and node 36 is low.

Figure 4:
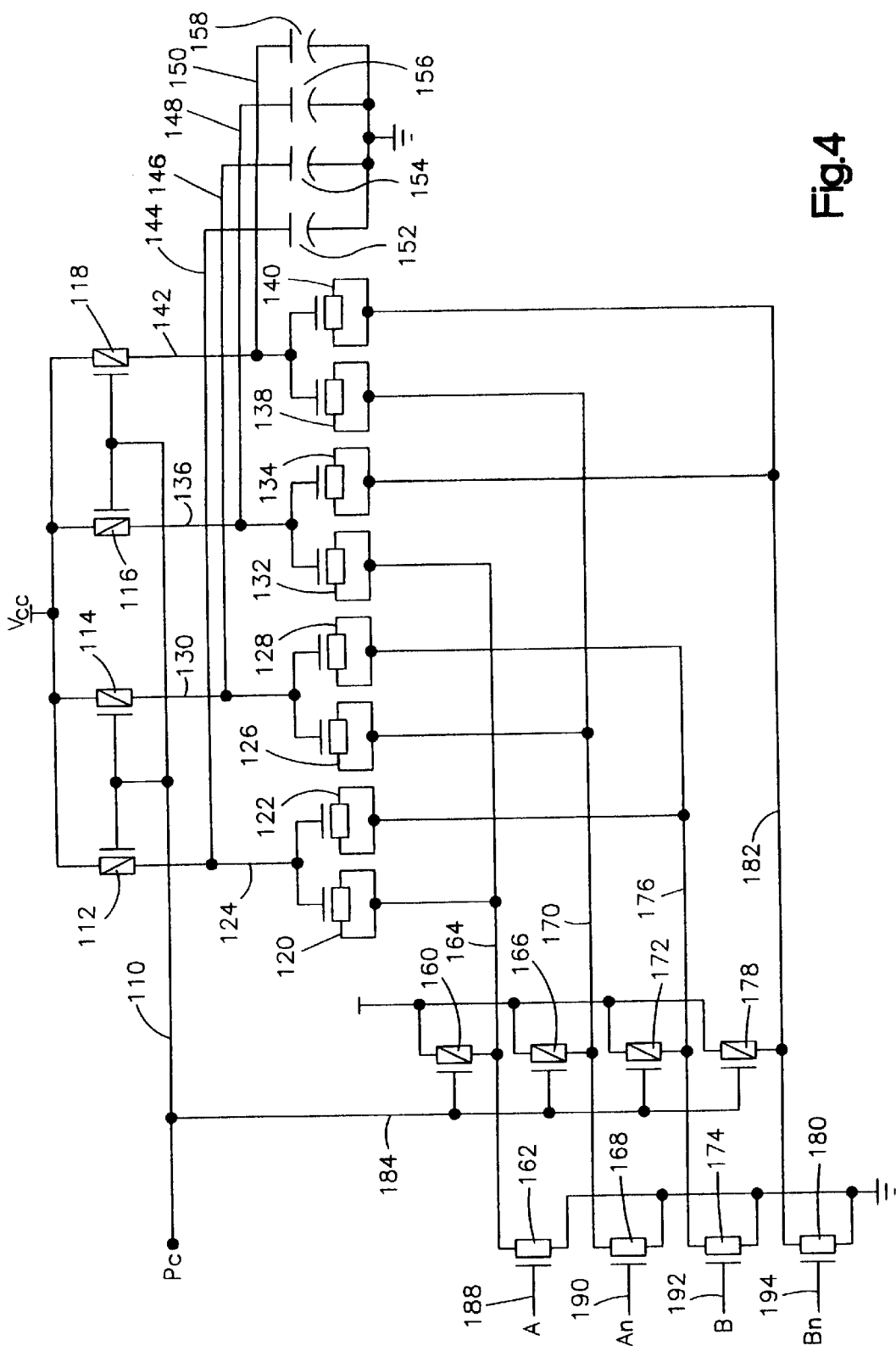
FIG. 4 is a circuit diagram of a limited swing positive select charge driven decoder according to this invention.

Referring now to FIG. 4 the circuit diagram of a limited swing positive select charge decoder according to this invention is shown. In positive select decoders, the selected output line or node stays high, e.g. at the precharge Voltage, and all of the other output lines or nodes are driven lower. As can be seen in FIG. 4 a precharge control line 110 is provided which is; connected to the gates of each of four PFET transistors 112, 114, 116, and 118. The sources of the PFETs 112, 114, 116 and 118 are connected to system voltage Vcc for precharging the nodes as will be described presently. As was indicated previously, one typical value for Vcc is 3.3 volts. The drain of PFET 112 is connected to the gates of Inversion NMOS NFETs 120 and 122 through circuit trace 124; the drain of PFET 114 is connected to the gates of Inversion NMOS NFETs 126 and 128 by circuit trace 130; the drain of PFET 116 is connected to the gates of Inversion NMOS NFETs 132 and 134 by circuit trace 136; and, the drain of PFET 118 is connected to the gates of Inversion NMOS NFETs 138 and 140 by circuit trace 142.

The circuit traces 124, 130, 136 and 142 are connected respectively to output nodes 144, 146, 148 and 150. The output nodes 144, 146, 148 and 150 are connected respectively to capacitors 152, 154, 156 and 158. The capacitance value of each of the Inversion NMOS NFETs 120, 122, 126, 128, 132, 134, 138 and 140 is selected to have a specific ratio to the capacitance values of each of the capacitors 152, 154, 156 and 158, e.g. A particularly desirable ratio is about one to ten (1:10) which will reduce the voltage i.e. a ΔV by about 0.3 Volts.

The source/drain of NFETs 120 and 132 are connected to the drain of PFET 160 and drain of NFET 162 by circuit trace 164; the source/drain of NFETs 126 and 138 are connected to the drain of PFET 166 and drain of NFET 168 by circuit trace 170; the source/drain of NFETs 122 and 128 are connected to the drain of PFET 172 and drain of NFET 174 by circuit trace 176; and, the source/drain of NFETs 134 and 140 are connected to drain of PFET 178 and drain of NFET 180 by circuit trace 182. The gates of PFETs 160, 166, 172 and 178 are connected to precharge control line 110, and the sources of PFETs 160, 166, 172 and 178 are connected to Vcc by circuit trace 184.

Figure 4A:
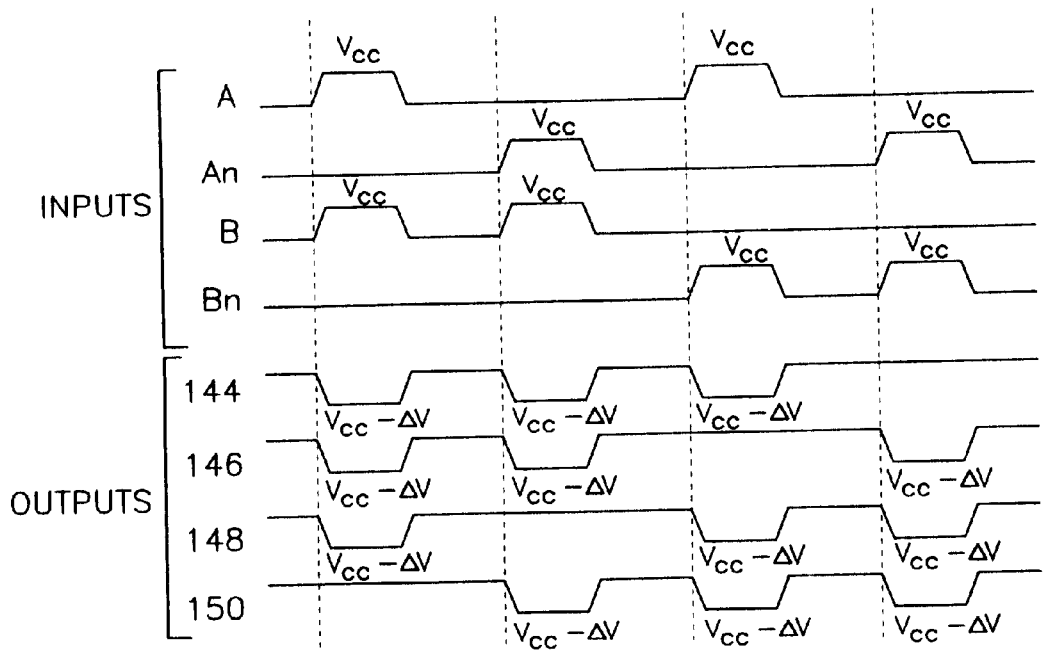
FIG. 4a is a signal diagram of the operation of the decoder of FIG. 4.

The operation of the circuit in FIG, 4 is as follows, with FIG. 4a showing the wave forms of the input and output signals. It should be remembered that this embodiment is a positive select decoder which means that the selected output node stays high and the non-selected nodes are driven lower. When the signal on the precharge control line 110 is low, PFETs 112, 114, 116 and 118 are "on", and Vcc precharges all of the nodes 144, 146, 148 and 150 to the Vcc Voltage, e.g. 3.3 volts, and the PFEFs 160, 166, 172 and 178 are also "on" which precharges the source drains of inversion NFETs 120, 122, 126, 128 132,134, 138 and 140 to Vcc e.g. 3.3 V. When one of the signals A, An, B, or Bn becomes active high, the signal on the precharge control line 110 goes high, turning off the PFETs 112, 114, 116 and 118 thus isolating the precharge, e.g. 3.3 volts on the nodes 144, 146, 148 and 150. Truth Table 2 below shows the outputs on nodes 144, 146, 148 and 150 with different combinations of high/low A, An, B and Bn input signals.

TABLE II

| INPUT | | | | OUTPUT | | | |
|---|---|---|---|---|---|---|---|
| A | An | B | Bn | 144 | 146 | 148 | 150 |
| VCC | 0 | VCC | 0 | VCC-2?V | VCC-?V | VCC-?V | VCC |
| 0 | VCC | VCC | 0 | VCC-?V | VCC-2?V | VCC | VCC-?V |
| VCC | 0 | 0 | VCC | VCC-?V | VCC | VCC-2?V | VCC-?V |
| 0 | VCC | 0 | VCC | VCC | VCC-?V | VCC-?V | VCC-2?V |

OUTPUT Voltages:
Selected OUTPUT = VCC
Unselected OUTPUT - VCC-2?V or VCC-?V

Assuming signals A and B go active high, then An and Bn will remain low. In such a case the signal on traces 188 and 192 go high turning on NFETs 162 and 174. Since the signals An and Bn remain low, NFETS 168 and 180 remain off. and PFETs 160, 166, 172 and 178 are also turned off. This will keep the same voltage on both sides of the NFETs 120, 122, 126, 128, 132, 134, 138 and 140. This will create a path from the source/drain of inversion capacitor NFETs 120 and 132 to ground through NFET 162 and a path from source/drain of inversion capacitor NFETs 122 and 128 to ground through NFET 174. Since NFETs 168 and 180 are turned "off" the source/drain of NFETs 126, 138, 134 and 140 will remain at precharge level of Vcc. Thus, output 150 becomes the selected output at Vcc and outputs 144, 146 and 148 are unselected at less than Vcc.

Figure 5:
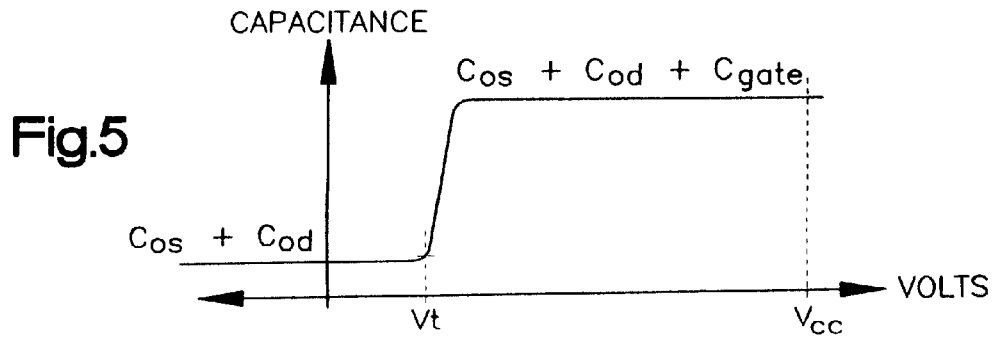
FIG. 5 depicts the capacitance/voltage characteristics of and inversion capacitor NFET.

Hence, generally there will be a large voltage increase across inversion capacitor NFETs 120, 122, 128 and 132 and a small decrease in voltage across inversion capacitor NFETs 126 and 134. A decrease in voltage of the unselected outputs 144, 146 and 148 from the VCC precharge level is caused by charge transfer between the output load capacitance and the NFET inversion capacitors and can be calculated from the capacitance/voltage characteristic of the inversion capacitor NFET. As is well known in the art, an NFET inversion capacitor has a non-linear capacitance/voltage characteristic as shown in FIG. 5. Below threshold voltage Vt, no inversion layer is formed in the channel and the capacitance from gate to source/drain is only the overlap capacitance $C_{os}$ (Source) and $C_{od}$(Drain). Above Vt, the thin oxide inversion layer capacitance to the gate electrode $C_{gate}$ dominates and the total capacitance becomes $C_{os}+C_{od}+C_{gate}$ as shown. Thus, the voltage of each of the unselected outputs 144, 146 and 148 is calculated as follows: Focusing now on output 146 and referring to FIG. 6, the output voltage at node 146 is lowered by charge supplied from NFET inversion capacitor 128 which experiences a voltage change from 0 volts to $V_{cc}-\Delta V$ volts. This voltage change across 128 corresponds to charge $Q_1$ and is calculated by integrating the capacitance/voltage characteristic of the NFET inversion capacitor of FIG. 5 from 0 volts to $V_{cc}-\Delta V$ volts as shown by the shaded portion of the curve. If the output load capacitance of each of the output load capacitors 152, 154, 156 and 158 has a value $C_{load}$, then the voltage change of each unselected output can be calculated. Thus, the voltage decrease $\Delta V$ of output 146 is calculated as $\Delta V=Q_1/C_{load}$ and is also identical for output 148. Charge $Q_2$ is supplied to output node 144 from two NFFT inversion capacitors 120 and 122 acting in parallel which experience a voltage change from 0V to approximately $V_{cc}-2\Delta V$ as shown in FIG. 7. The voltage decrease of output 144 is then $2Q_2/C_{load}$. If $\Delta V$ is a very small voltage compared to the power supply voltage VCC, then to a first order $Q_1$ will be approximately equal to $Q_2$. Therefore, the voltage decrease of the unselected output 144 is approximately $2\Delta V$ as shown in FIG. 7.

$2Q_2/C_{load}=2Q_1/(C_{load}=2\Delta V$

Figure 8:
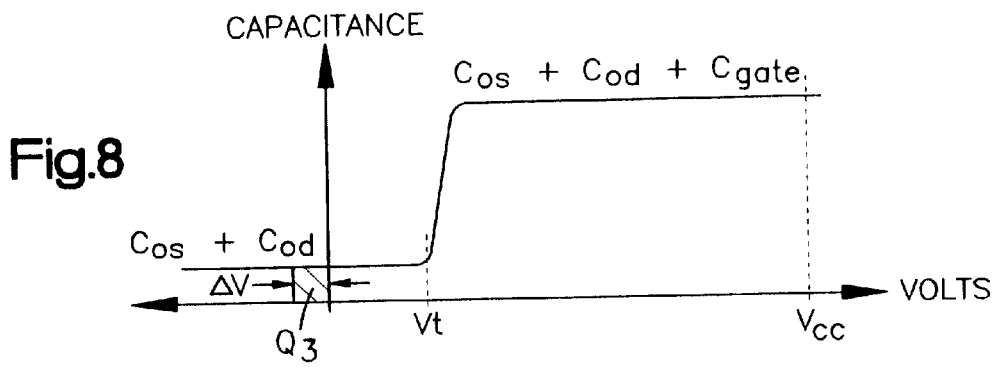
FIG. 8 depicts the voltage drop across NFETs 126 and 134 of FIG. 4.

Returning now to output nodes 146 and 148, it is important to observe the functioning of NFET inversion capacitors 126 and 134 which are an important element of the invention. The source/drain electrodes of these devices remain at $V_{cc}$ precharge while output nodes 146 and 148 are decreased by $\Delta V$ from $V_{cc}$. Therefore, the voltage change across 126 and 134 is $-\Delta V$ which is always below Vt as shown in FIG. 8. This voltage change $-\Delta V$ corresponds to charge $Q_3$ and is a very small charge compared to $Q_1$ and $Q_2$. Thus, capacitors 126 and 134 present only a small undesired additional capacitive load on outputs 146 and 148 and do not substantially affect the unselected voltage decrease $\Delta V$ on these outputs. This would not be the case if NFET inversion capacitors 126 and 134 were replaced with linear (voltage independent) capacitors. Linear capacitors would have large undesired additional loading causing reduced $\Delta V$. This effect becomes more pronounced in larger decoders where three of four capacitors are connected to each output node, but only one supplies charge to the output and the others are only undesired parasitic loading. Thus, NFET inversion capacitors are preferred.

The function of the NFET inversion capacitor is analogous to function of the junction diode of the prior art of FIG. 2. The diode conducts current only under positive bias like the NFET inversion capacitor conducts charge only under positive bias. Table II shows the voltage at each of the output nodes 144, 146, 148 and 150 according to the logical input combinations of inputs A, An, B and Bn. Thus, as seen in Table 2, the Voltage at node 144 is Vcc−2ΔV (since the FETs 120 and 122 are in parallel and both are connected to ground); the voltage at node 146 is Vcc−ΔV (since NFET 128 is connected to ground and NFET 126 is isolated form ground); the voltage at node 148 is Vcc−ΔV (since NFET 132 is connected to ground and NFFT 134 is isolated from ground); and, the voltage at node 150 is Vcc (since both NFETs 138 and 140 are isolated from ground). Thus with the embodiment shown in FIG. 4 there is positive select. If the Vcc voltage is 3.3 volts, and the inputs at A and B go active high, then the voltage at node 144 is about 2.7V (3.3−2×0.3), at node 146 about 3V (3.3−0.3), at node 148 about 3(3.3−0.3 ), and at node 150 about 3.3 V (3.3−0). Table 2 shows the output voltages at the different nodes with different combinations of the input signals A, An, B and Bn being high and low. Similar calculations and characteristics with respect to FIG. 3 will be apparent to those skilled in the art.

In the case of both the embodiments of FIGS. 3 and 4, when the precharge control line 10 or 110 returns to its non activated state of being low, the precharge is restored by turning the PFETs 12, 14, 16 and 18 "on" in the case of FIG. 3, and the PFETs 112, 114, 116, 118, 162, 168, 174 and 180 "on" in the case of FIG. 4. The decode device then is ready for another decode cycle.

Figure 6:
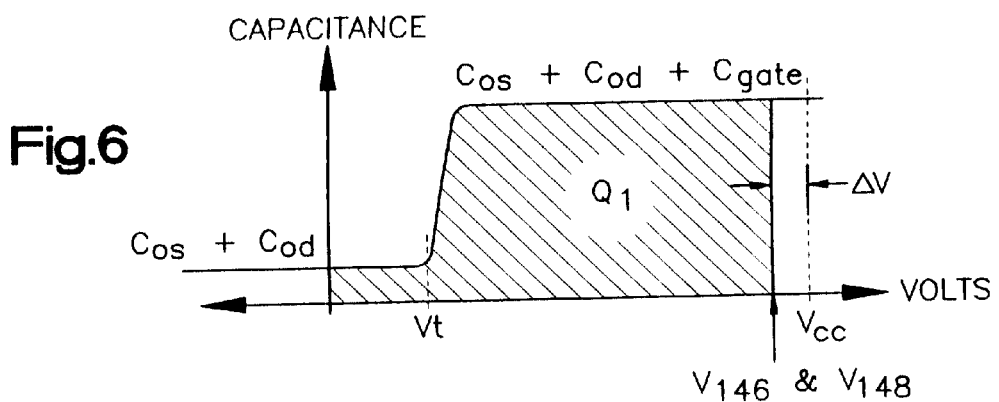
FIG. 6 depicts the values of outputs 146 and 148 of the circuit of FIG. 4.
Figure 7:
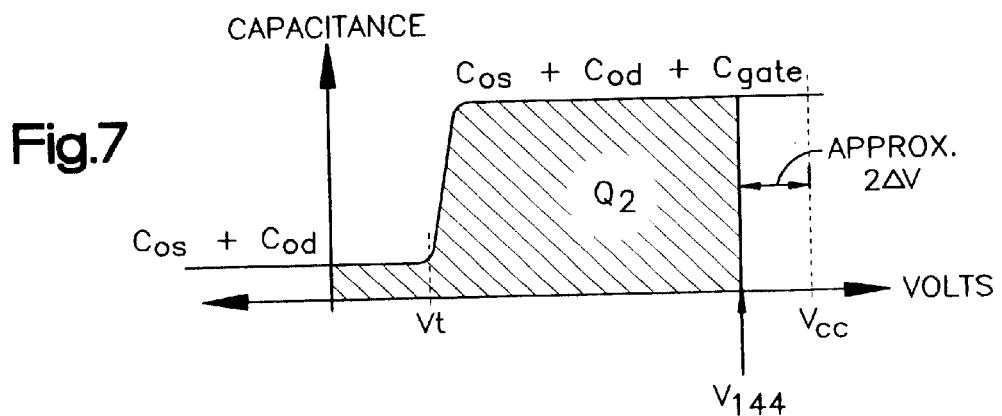
FIG. 7 depicts the values of output 144 of FIG. 4.

Optimum operation of the decoder of FIG. 3, and particularly the decoder of FIG. 4, occurs when the charge Q1 of FIG. 6 is maximized and the charge Q3 of FIG. 8 is minimized. This will be achieved if Vt of the NFET inversion capacitor device is zero volts. A zero volt Vt device is possible in any CMOS process by appropriate channel implants. A first advantage realized with a zero volt Vt device is that the maximum capacitance Cos+Cod+Cgate will occur at the start of the drive of the common source/drain node of the NFET inversion capacitor from Vcc precharge toward ground. Although not shown in the schematics of FIG. 3 and FIG. 4, parasitic junction capacitance is always present at the source and drain electrodes which slows the fall of the node. At less than optimum Vt, for example Vt=1 volt, the node must fall to Vcc−1V until the maximum capacitance condition is reached. Therefore, charge Q1 will not begin transfer to the output node until after a delay period to reach Vcc−1V at the source/drain node. Yet a second advantage with a zero volt Vt device is that the decoder minimum operating voltage Vcc is not limited by the NFET inversion capacitor threshold as in the example case where Vt=1V. Consequently, in this example, Vcc must be at least 1 volt for the decoder to function at all. Thus, a zero volt Vt device is necessary for low Vcc voltage operation.

Figure 9A:
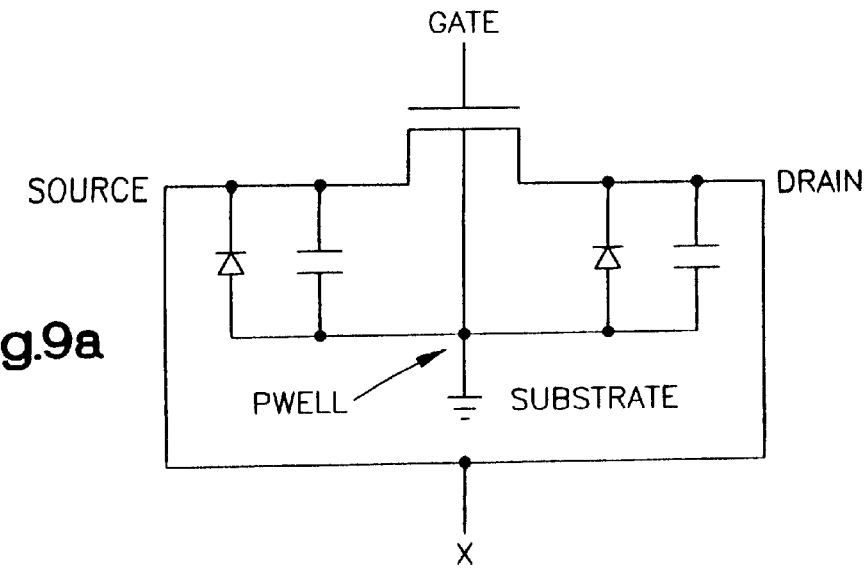
FIGS. 9a–9c show diagramatically various configurations for NFET inversion capacitors.
Figure 9B:
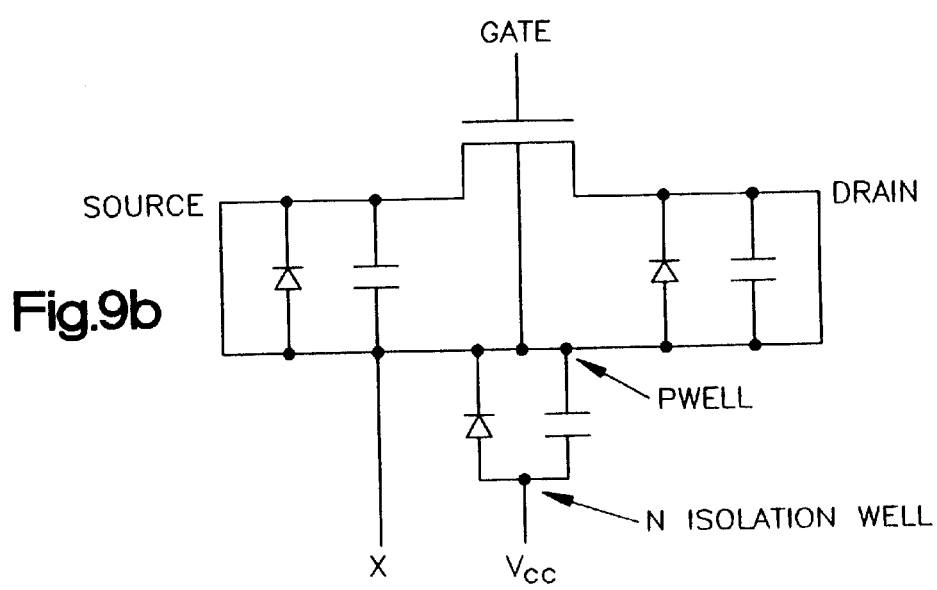
Figure 9C:
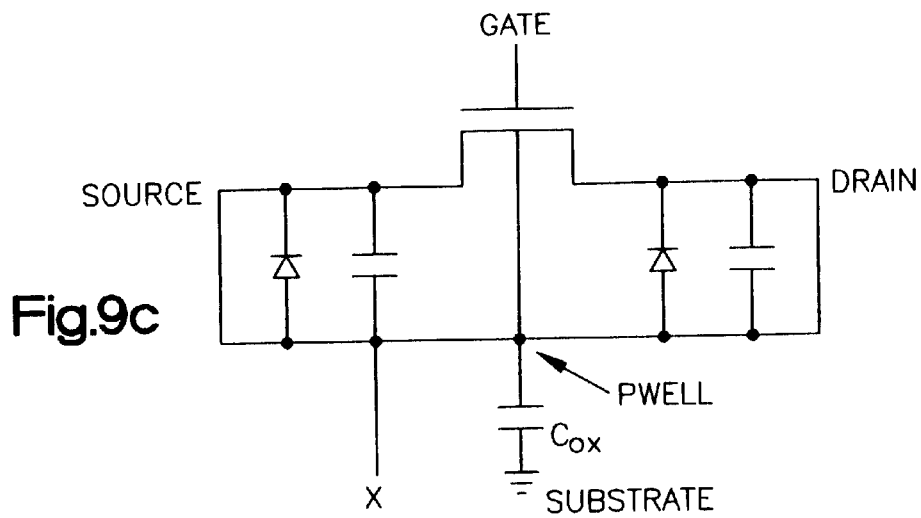

FIGS. 9a–9c show various configuration options for the NFET inversion capacitor with its source, drain and isolated PWELL junctions and associated junction capacitance. FIG. 9a represents a typical case where the body or PWELL is connected to the substrate at ground potential. In this case, the source/drain junction capacitances become undesired parasitic loading on the node X as shown, where node X corresponds to any one of the nodes 60 or 66 in FIG. 3 or 164, 170, 176 and 182 in FIG. 4. Also, body effect in this typical case causes the Vt to increase significantly. An option to lower Vt by eliminating the body effect is to place the NFET inversion capacitor in an isolated PWELL region where the body can be connected to the source and drain nodes as shown in FIG. 9b. In this configuration, the source/drain capacitance is shorted out and the parasitic capacitive load on node X becomes the PWELL to N isolation well capacitance. The best technology embodiment for the decoders of FIGS. 3 and 4 is a SOI (silicon on insulator) process where the active CMOS devices are fabricated on top of an insulating back oxide layer between these devices and the bulk silicon substrate. In this technology, the NFET inversion capacitor will have the advantage of the lowest possible body to bulk capacitance Cox shown in FIG. 9c compared to the relatively high PWELL to N isolation well capacitance of FIG. 9b.

Of course it is to be understood that more than two input signals an their complements can be decoded to more than four decoded signals. For example three input signals and their complements can be decoded to one of eight output signals. Thus n input signals and their complements can be decoded to one of m output signals.

The present invention is especially adapted to be implemented in integrated circuit chips such as DRAMs, SRAMs, and ASICs, which chips can be included in computers either on add-on modules or directly in the CPU of the computer.

While the invention had been described with a certain degree of particularity, various adaptations and modifications can be made without departing from the scope of the invention as defined in the appended claims.

What is claimed is:

1. A method of decoding n input signals each having a true value and a complement value to one of m output signals comprising the steps of;
    providing a capacitive network having a capacitive load on each of m output nodes;
    precharging all of the capacitive loaded output nodes of the capacitive network to a given voltage value;
    providing n true input signals and their complements, each having either a high or low value;
    discharging at least one but less than all of the output nodes to a value less than said given voltage and greater than ground in output patterns responsive to given input patterns of the true and complement values of the input signals, the output patterns of the discharged nodes being such as to provide one and only one discharged node or one and only one undischarged node for any given pattern of input signals.

2. The invention as defined in claim 1 wherein there is only one discharged node in any output pattern.

3. The invention as defined in claim 1 wherein there is only one undischarged node in any output pattern.

4. The invention as defined in claim 1 wherein said capacitive network includes a non-linear capacitive element having relatively higher capacitance above a given voltage threshold and a relatively lower capacitance below said given voltage threshold.

5. The invention as defined in claim 4 wherein the threshold is essentially "0" volts.

6. The invention as defined in claim 4 wherein the non-linear capacitive element is formed on a silicon substrate.

7. The invention as defined in claim 4 wherein the capacitive network includes an inversion NFET transistor.

8. The invention as defined in claim 1 wherein there is circuitry to isolate the precharge voltage from the capacitive network responsive to an input control signal.

9. The invention as defined in claim 1 wherein the capacitive network is operative responsive to FET's.

10. The invention as defined in claim 1 wherein the input signals are gated by FETs.

11. The invention as defined in claim 4 wherein there are capacitors on each node.

12. The invention as defined in claim 11 wherein each capacitor on each node has a capacitance greater than the capacitance of each inversion transistor.

13. A circuit for decoding n input signals, each having a true value and a complement value to one of m output signals comprising;
    a capacitive network having a capacitive load on each of m output nodes;
    circuitry for precharging all of the capacitively loaded output nodes of the capacitive network to a given voltage value;
    circuitry for inputting n true input signals and their complements, each having either a high or low value; and
    circuitry for discharging at least one but less than all of the output nodes to a value less than said given voltage and greater than ground in output patterns responsive to given input patterns of the true and complement values of the input signals, the output patterns of the discharged nodes being such as to provide one and only one discharged node or one and only one undischarged node for any given pattern of input signals.

14. The invention as defined in claim 13 wherein there is only one discharged node in any output pattern.

15. The invention as defined in claim 13 wherein there is only one undischarged node in any output pattern.

16. The invention as defined in claim 13 wherein said capacitive network includes a non-linear capacitive element having relatively higher capacitance above a given voltage threshold and a relatively lower capacitance below said given voltage threshold.

17. The invention as defined in claim 16 wherein the voltage threshold is essentially "0" volts.

18. The invention as defined in claim 16 wherein the non-linear capacitive element is formed on a silicon substrate.

19. The invention as defined in claim 13 wherein the capacitive network includes an inversion NFET transistor.

20. The invention as defined in claim 13 wherein there is circuitry to isolate the precharge voltage from the capacitive network responsive to an input control signal.

21. The invention as defined in claim 13 wherein the capacitive network is operative responsive to FETs.

22. The invention as defined in claim 16 wherein the input signals are gated by FETs.

23. The invention as defined in claim 16 wherein there are capacitors on each node.

24. The invention as defined in claim 13 wherein each capacitor on each node has a capacitance greater than the capacitance of each inversion transistor.

25. An integrated circuit chip, comprising:
a circuit for decoding n input signals, each having a true value and a complement value to one of m output signals, said circuit including:
a capacitive network having a capacitive load on each of m output nodes;
circuitry for precharging all of the capacitively loaded output nodes of the capacitive network to a given voltage value;
circuitry for inputting n true input signals and their complements, each having either a high or low value; and
circuitry for discharging at least one but less than all of the output nodes to a value less than said given voltage and greater than ground in output patterns responsive to given input patterns of the true and complement values of the input signals, the output patterns of the discharged nodes being such as to provide one and only one discharged node or one and only one undischarged node for any given pattern of input signals.

26. The invention as defined in claim 25 wherein said capacitive network includes a non-linear capacitive element having relatively higher capacitance above a given voltage threshold and a relatively lower capacitance below said given voltage threshold.

27. The invention as defined in claim 26 wherein the voltage threshold is essentially "0" volts.

28. The invention as defined in claim 26 wherein the non-linear capacitive element is formed on a silicon substrate.

29. The invention as defined in claim 26 wherein the capacitive network includes an inversion NFET transistor.

30. The invention as defined in claim 26 wherein there are capacitors on each node.

31. A computer, comprising:
a circuit for decoding n input signals, each having a true value and a complement value to one of m output signals, said circuit including:
a capacitive network having a capacitive load on each of m output nodes;
circuitry for precharging all of the capacitively loaded output nodes of the capacitive network to a given voltage value;
circuitry for inputting n true input signals and their complements, each having either a high or low value; and
circuitry for discharging at least one but less than all of the output nodes to a value less than said given voltage and greater than ground in output patterns responsive to given input patterns of the true and complement values of the input signals, the output patterns of the discharged nodes being such as to provide one and only one discharged node or one and only one undischarged node for any given pattern of input signals.

32. The invention as defined in claim 25 wherein said capacitive network includes a non-linear capacitive element having relatively higher capacitance above a given voltage threshold and a relatively lower capacitance below said given voltage threshold.

33. The invention as defined in claim 32 wherein the voltage threshold is essentially "0" volts.

34. The invention as defined in claim 32 wherein the non-linear capacitive element is formed on a silicon substrate.

35. The invention as defined in claim 32 wherein the capacitive network includes an inversion NFET transistor.

36. The invention as defined in claim 35 wherein there are capacitors on each node.

37. The invention as defined in claim 1 wherein said capacitive network includes a non-linear capacitive element wherein the optimized threshold is zero volts.

38. The invention as defined in claim 27 wherein said NFET inversion transistor has the body effect eliminated by connecting the body to the source and drain electrodes.

39. The invention as defined in claim 27 wherein said NEFT inversion transistor is fabricated in Silicon-on-Insulator technology to lower the body capacitance.

* * * * *